(12) United States Patent
Arslan et al.

(10) Patent No.: US 11,405,136 B1
(45) Date of Patent: Aug. 2, 2022

(54) VITERBI EQUALIZER WITH SOFT DECISIONS

(71) Applicant: Silicon Laboratories Inc., Austin, TX (US)

(72) Inventors: Guner Arslan, Austin, TX (US); Chester Yu, Austin, TX (US); Mehmood Ur Rehman Awan, Brønshøj (DK)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/237,541

(22) Filed: Apr. 22, 2021

(51) Int. Cl.
*H04L 1/00* (2006.01)
*H04L 25/03* (2006.01)
*H03M 13/41* (2006.01)

(52) U.S. Cl.
CPC .......... *H04L 1/0054* (2013.01); *H03M 13/41* (2013.01); *H04L 25/03* (2013.01)

(58) Field of Classification Search
CPC ....... H04L 1/0054; H04L 25/03; H03M 13/41
See application file for complete search history.

(56) References Cited

U.S. PATENT DOCUMENTS

| 5,940,416 A * | 8/1999 | Nishiya ............ G11B 20/10009 714/795 |
| 2001/0026593 A1* | 10/2001 | Matsunaga ......... H04L 27/2332 375/262 |

OTHER PUBLICATIONS

Forney Jr., "The Viterbi Algorithm", Proceedings of the IEEE, vol. 61, No. 3, pp. 268-278, Mar. 1973.
Hagenauer et al., "A Viterbi Algorithm with Soft-Decision Outputs and its Applications", 1989 IEEE Global Telecommunications Conference and Exhibition, pp. 1680-1686, 1989.

* cited by examiner

*Primary Examiner* — Thien Nguyen
(74) *Attorney, Agent, or Firm* — Nields, Lemack & Frame, LLC

(57) ABSTRACT

A Viterbi Equalizer having a limited number of stages is disclosed. In some embodiments, the Viterbi Equalizer may have only four stages. The Viterbi Equalizer produces soft decisions, which comprise a final decision and reliability information related to that final decision. The Viterbi Equalizer is able to provide reliability information even if all paths do not converge on the final decision at the last stage. The reliability information is calculated based on if and when the paths in the trellis converge on a final decision. This reliability information can be used downstream, such as by another Viterbi Algorithm block to perform forward error correction. The use of soft decision provides gains of up to several dB in performance. Additionally, the Viterbi Equalizer is low cost and readily implemented in hardware or software.

19 Claims, 12 Drawing Sheets

VITERBI EQUALIZER WITH SOFT DECISIONS

FIELD

This disclosure describes systems and methods for implementing a Viterbi Equalizer that provides soft decisions in a small number of stages.

BACKGROUND

Data communications require the formatting, encoding and modulation of data from a sending device to a receiving device. In many communication systems, the communication channel, which may be a cable, wire or another medium, such as air, introduces errors, due to noise, bandwidth limitations or other factors.

Thus, in some embodiments, special techniques are used at the receiving device to reconstruct the received data. The Viterbi algorithm has become an essential in communication receivers, performing demodulation, decoding, equalization and other functions. A concatenation of two Viterbi Algorithm blocks is often used in many applications. These Viterbi Algorithm blocks may be arranged in series, such that the output from the first Viterbi Algorithm block is used as the input to the second Viterbi Algorithm block. For example, the inner Viterbi Algorithm block may be an equalizer, which provides outputs to the outer Viterbi Algorithm block, which performs forward error correction.

One limitation in this approach is that the inner Viterbi Algorithm block only produces hard decisions, which leads to a reduction in performance of the outer Viterbi Algorithm block.

Previous approaches to using a Viterbi Algorithm block are directed toward implementations where the paths are sufficiently long such that the paths all merge. However, these long paths introduce an unacceptably long time delay in the decoding of incoming data.

Therefore, it would be beneficial if there were a system and method that utilizes a Viterbi equalizer that generates soft decisions. Further, it would be advantageous if this Viterbi equalizer utilizes a limited number of stages, such as 4 stages.

SUMMARY

A Viterbi Equalizer having a limited number of stages is disclosed. In some embodiments, the Viterbi Equalizer may have only four stages. The Viterbi Equalizer produces soft decisions, which comprise a final decision and reliability information related to that final decision. The Viterbi Equalizer is able to provide reliability information even if all paths do not converge on the final decision at the last stage. The reliability information is calculated based on if and when the paths in the trellis converge on a final decision. This reliability information can be used downstream, such as by another Viterbi Algorithm block to perform forward error correction. The use of soft decision provides gains of up to several dB in performance. Additionally, the Viterbi Equalizer is low cost and readily implemented in hardware or software.

According to one embodiment, a Viterbi Equalizer is disclosed. The Viterbi Equalizer comprises a first plurality of stages, each stage comprising a second plurality of states, wherein an input to the Viterbi Equalizer comprises a stream of differentiated phase values, each indicative of the differentiated phase of an incoming data bit, wherein the Viterbi Equalizer is configured to determine a value of each incoming data bit based on the differentiated phase values, wherein the Viterbi Equalizer outputs a final decision and a reliability information associated with the final decision. In certain embodiments, the first plurality comprises four stages. In some embodiments, the second plurality comprises four states. In some embodiments, branch metrics between states are calculated based on a difference between the differentiated phase value and an expected value, wherein the expected value is determined based on a differentiated phase value of the incoming data bit and the differentiated phase values of incoming data bits immediately adjacent to the incoming data bit. In certain embodiments, six expected values are used in calculating the branch metrics. In some embodiments, a first expected value is used when the incoming data bit is a one and the incoming data bits immediately adjacent to the incoming data bit are also one; and a second expected value, having an equal amplitude and opposite polarity of the first expected value is used when the incoming data bit is a zero and the incoming data bits immediately adjacent to the incoming data bit are also zero. In some embodiments, a third expected value is used when the incoming data bit is a one and the incoming data bits immediately adjacent to the incoming data bit are zero; and a fourth expected value, having an equal amplitude and opposite polarity of the third expected value is used when the incoming data bit is a zero and the incoming data bits immediately adjacent to the incoming data bit are one. In certain embodiments, a fifth expected value is used when the incoming data bit is a one and exactly one of the incoming data bits immediately adjacent to the incoming data bit is one; and a sixth expected value, having an equal amplitude and opposite polarity of the fifth expected value is used when the incoming data bit is a zero and exactly one of the incoming data bits immediately adjacent to the incoming data bit is zero. In certain embodiments, the reliability information is calculated as a maximum value, if all paths in the Viterbi Equalizer converge on a same final decision in a stage prior to a last stage. In certain embodiments, a path from a first stage to a last stage having a smallest path metric is referred to as a survivor path, and a state in the last stage where the survivor path terminates is referred to as a terminal state, and the reliability information is calculated based on a difference in path metrics between two paths leading to a terminal state if all paths in the Viterbi Equalizer converge on a same final decision in the last stage. In certain embodiments, a path from a first stage to a last stage having a smallest path metric is referred to as a survivor path, and a state in the last stage where the survivor path terminates is referred to as a terminal state and is used to determine the final decision, and at least one state in the last stage reaches a different final decision, and the reliability information is calculated based on a difference in path metrics between the survivor path and a smallest path leading to a state in the last stage that reaches the different final decision.

According to another embodiment, a Viterbi Equalizer is disclosed. The Viterbi Equalizer comprises a first plurality of stages, each stage comprising a second plurality of states, wherein an input to the Viterbi Equalizer comprises a stream of input values, each indicative of an incoming data bit, the Viterbi Equalizer is configured to determine a value of each incoming data bit based on the input values, the Viterbi Equalizer outputs a final decision and a reliability information associated with the final decision, and all paths within the Viterbi Equalizer are not guaranteed to converge on the final decision in a last stage. In some embodiments, the reliability information is calculated as a maximum value, if all paths in the Viterbi Equalizer converge on a same final decision in a stage prior to the last stage. In some embodiments, a path from a first stage to the last stage having a smallest path metric is referred to as a survivor path, and a state in the last stage where the survivor path terminates is referred to as a terminal state, and the reliability information is calculated based on a difference in path metrics between two paths leading to the terminal state if all paths in the Viterbi Equalizer converge on a same final decision in the last stage. In certain embodiments, a path from a first stage to the last stage having a smallest path metric is referred to as a survivor path, and a state in the last stage where the survivor path terminates is referred to as a terminal state and is used to determine the final decision, and at least one state in the last stage reaches a different final decision, and the reliability information is calculated based on a difference in path metrics between the survivor path and a smallest path leading to a state in the last stage that reaches the different final decision. In certain embodiments, the first plurality of stages comprises 16 or fewer stages.

According to another embodiment, a Viterbi Equalizer is disclosed The Viterbi Equalizer comprises a first plurality of stages, each stage comprising a second plurality of states, wherein an input to the Viterbi Equalizer comprises a stream of input values, each indicative of an incoming data bit, the Viterbi Equalizer is configured to determine a value of each incoming data bit based on the input values, the Viterbi Equalizer outputs a final decision and a reliability information associated with the final decision, and a path from a first stage to the last stage having a smallest path metric is referred to as a survivor path, and a state in the last stage where the survivor path terminates is referred to as a terminal state and is used to determine the final decision, and at least one state in the last stage reaches a different final decision, and the reliability information is calculated based on a difference in path metrics between the survivor path and a smallest path leading to a state in the last stage that reaches the different final decision. In certain embodiments, the reliability information is calculated based on a difference in path metrics between two paths leading to the terminal state if all paths in the Viterbi Equalizer converge on a same final decision in the last stage. In certain embodiments, the reliability information is set to a maximum value if all paths in the Viterbi Equalizer converge on the same final decision in a next to last stage

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
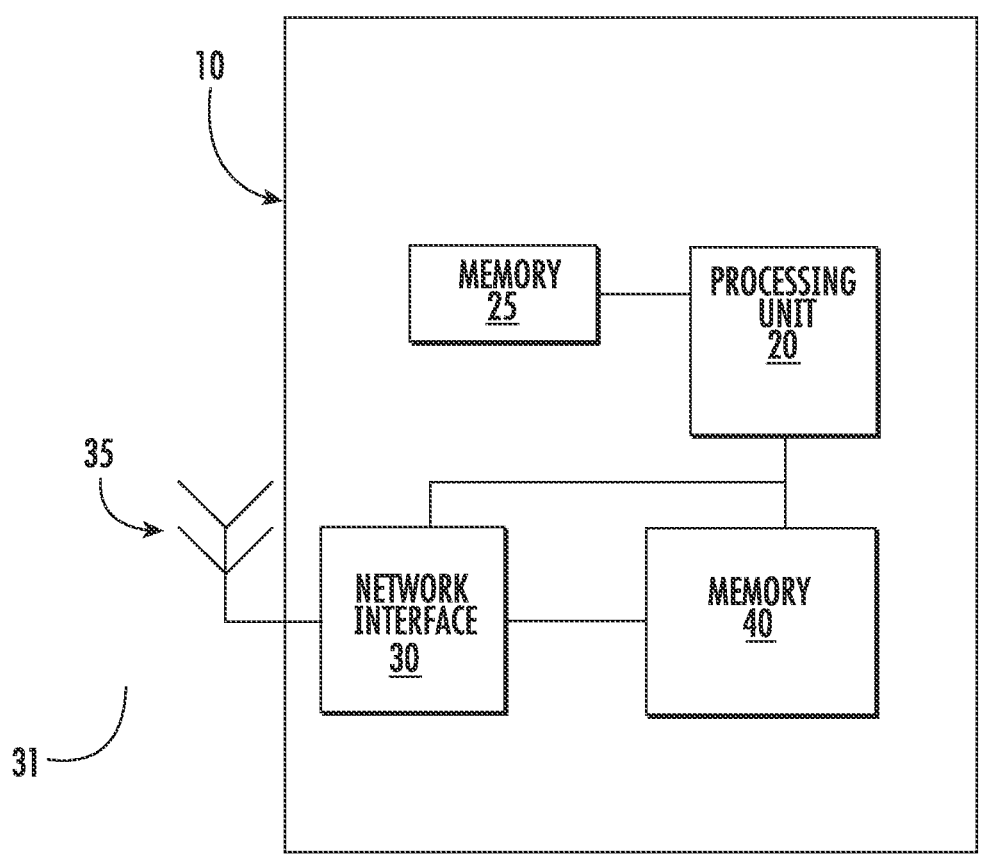
FIG. 1 is a block diagram of a representative network device that may utilize the Viterbi Equalizer according to one embodiment.

FIG. 1 shows a block diagram of a representative network device 10 that utilizes the Viterbi Equalizer that creates soft decisions according to one embodiment.

The network device 10 has a processing unit 20 and an associated memory device 25. The processing unit 20 may be any suitable component, such as a microprocessor, embedded processor, an application specific circuit, a programmable circuit, a microcontroller, or another similar device. This memory device 25 contains the instructions, which, when executed by the processing unit 20, enable the network device 10 to perform the functions described herein. This memory device 25 may be a non-volatile memory, such as a FLASH ROM, an electrically erasable ROM or other suitable devices. In other embodiments, the memory device 25 may be a volatile memory, such as a RAM or DRAM.

While a memory device 25 is disclosed, any computer readable medium may be employed to store these instructions. For example, read only memory (ROM), a random access memory (RAM), a magnetic storage device, such as a hard disk drive, or an optical storage device, such as a CD or DVD, may be employed. Furthermore, these instructions may be downloaded into the memory device 25, such as for example, over a network connection (not shown), via CD ROM, or by another mechanism. These instructions may be written in any programming language, which is not limited by this disclosure. Thus, in some embodiments, there may be multiple computer readable non-transitory media that contain the instructions described herein. The first computer readable non-transitory media may be in communication with the processing unit 20, as shown in FIG. 1A. The second computer readable non-transitory media may be a CDROM, or a different memory device, which is located remote from the network device 10. The instructions contained on this second computer readable non-transitory media may be downloaded onto the memory device 25 to allow execution of the instructions by the network device 10.

The network device 10 also includes a network interface 30, which may be a wireless interface that connects with an antenna 35. The network interface 30 may support any wireless network, such as Bluetooth, Wi-Fi, networks utilizing the IEEE 802.15.4 specification, such as Zigbee, networks utilizing the IEEE 802.15.6 specification, and wireless smart home protocols, such as Z-Wave. Further, the network interface 30 may also support a proprietary or custom wireless network.

The network device 10 may include a second memory device 40 in which data that is received and transmitted by the network interface 30 is stored. This second memory device 40 is traditionally a volatile memory. The processing unit 20 has the ability to read and write the second memory device 40 so as to communicate with the other nodes in the wireless network 31. Although not shown, the network device 10 also has a power supply, which may be a battery or a connection to a permanent power source, such as a wall outlet.

While the processing unit 20, the memory device 25, the network interface 30, and the second memory device 40 are shown in FIG. 1 as separate components, it is understood that some or all of these components may be integrated into a single electronic component. Rather, FIG. 1 is used to illustrate the functionality of the network device 10, not its physical configuration.

Figure 2A:
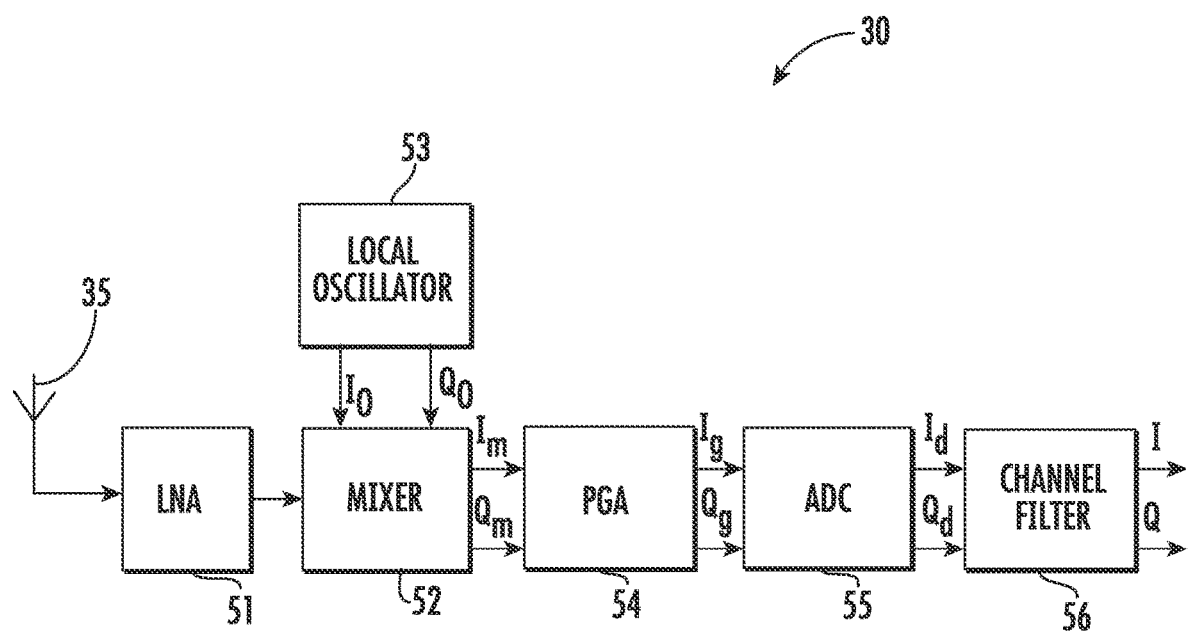
FIG. 2A is a detailed block diagram of a first part of the network interface of the network device of FIG. 1.
Figure 2B:
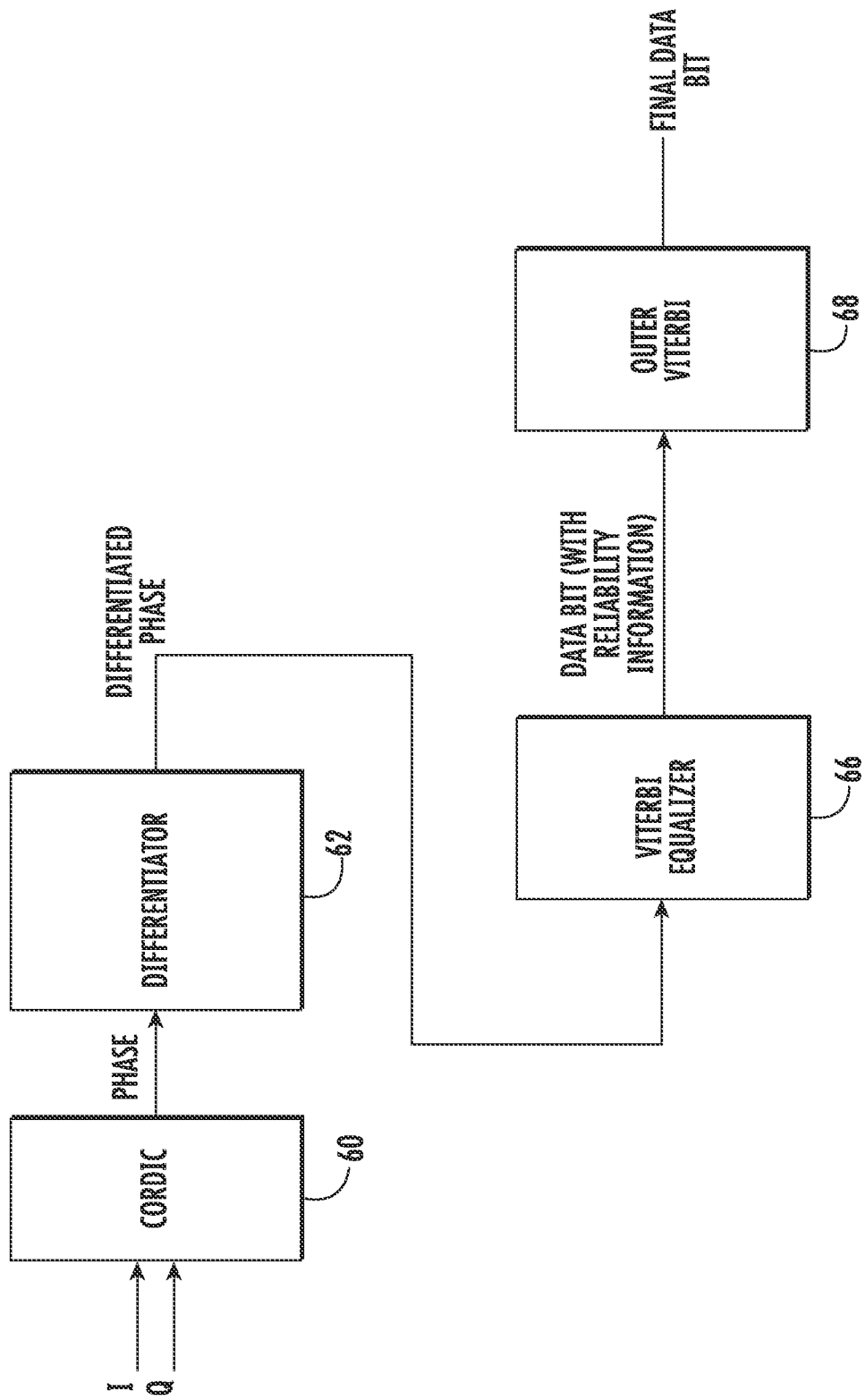
FIG. 2B is a detailed block diagram of a second part of the network interface of the network device of FIG. 1.

FIG. 2A-2B provide a more detailed illustration of the network interface 30. As shown in FIG. 2A, the wireless signals first enter the network interface 30 through the antenna 35. The antenna 35 is in electrical communication with a low noise amplifier (LNA) 51. The LNA 51 receives a very weak signal from the antenna 35 and amplifies that signal while maintaining the signal-to-noise ratio (SNR) of the incoming signal. The amplified signal is then passed to a mixer 52. The mixer 52 is also in communication with a local oscillator 53, which provides two phases to the mixer 52. The cosine of the frequency may be referred to as $I_o$, while the sin of the frequency may be referred to as $Q_o$. The $I_o$ signal is then multiplied by the incoming signal to create the inphase signal, $I_m$. The $Q_o$ signal is then multiplied by a 90° delayed version of the incoming signal to create the quadrature signal, $Q_m$. The inphase signal, $I_m$, and the quadrature signal, $Q_m$, from the mixer 52, are then fed into programmable gain amplifier (PGA) 54. The PGA 54 amplifies the $I_m$ and $Q_m$ signals by a programmable amount. These amplified signals may be referred to as $I_g$ and $Q_g$. The amplified signals, $I_g$ and $Q_g$, are then fed from the PGA 54 into an analog to digital converter (ADC) 55. The ADC 55 converts these analog signals to digital signals, $I_d$ and $Q_d$. These digital signals may then pass through a channel filter 56. The filtered signals are referred to as I and Q. These I and Q signals can be used to recreate the amplitude and phase of the original signal. In certain embodiments, the I and Q values may be considered complex numbers, wherein the I value is the real component and the Q value is the imaginary component.

As shown in FIG. 2B, the I and Q signals then enter a CORDIC (Coordination Rotation Digital Computer) 60, which determines the amplitude and phase of the signals. Amplitude is given as the square root of $I^2$ and $Q^2$, while phase is given by the $\tan^{-1}(Q/I)$. In some embodiments, the CORDIC 60 may be a hardware component disposed in the network interface 30. In other embodiments, the CORDIC may be implemented in software.

The phase output from the CORDIC 60 is then supplied as an input to the differentiator 62. As is well known, the derivative of phase is frequency. Thus, by subtracting the values of two adjacent phase values, and optionally dividing the difference by a time duration, a value that is indicative of frequency can be determined. In some embodiments, the differentiator 62 may be a hardware component disposed in the network interface 30. In other embodiments, the differentiator may be implemented in software. The differentiated phase may be a signed value, such as an 8-, 16- or 32-bit signed value.

The differentiated phase is used as an input to a Viterbi Equalizer 66. The Viterbi Equalizer 66 is used to determine the value of each data bit, based on the values of the adjacent data bits, as described in more detail below. The output from the Viterbi Equalizer 66 is the value of the data bit (i.e. 0 or 1) and the reliability of this value. In other words, rather than simply determining the value of a data bit, the Viterbi Equalizer 66 also provides information related to the likelihood that that the value is correct. For example, the reliability of the state may be expressed as a 5 bit value, from 1 to 31, where 31 indicates that the bit is almost certainly the determined value and 1 indicating that the Viterbi Equalizer is very unsure about the determined value. In some embodiments, the Viterbi Equalizer 66 may be a hardware component disposed in the network interface 30. In other embodiments, the Viterbi Equalizer may be implemented in software.

This value and reliability information is then input to an Outer Viterbi Block 68. The Outer Viterbi Block 68 decodes the forward error correction code applied at the transmitter using the data supplied to it by the Viterbi Equalizer 66. The output of the Outer Viterbi Block 68 is the final data bits, as determined by the two Viterbi blocks.

These final data bits may then be used by other components within the network interface 30, such as a cyclic redundancy check (CRC) or a decoder to decode the incoming data stream.

Having described many of the components in the network interface 30, the Viterbi Equalizer 66 will be described in more detail.

Figure 3:
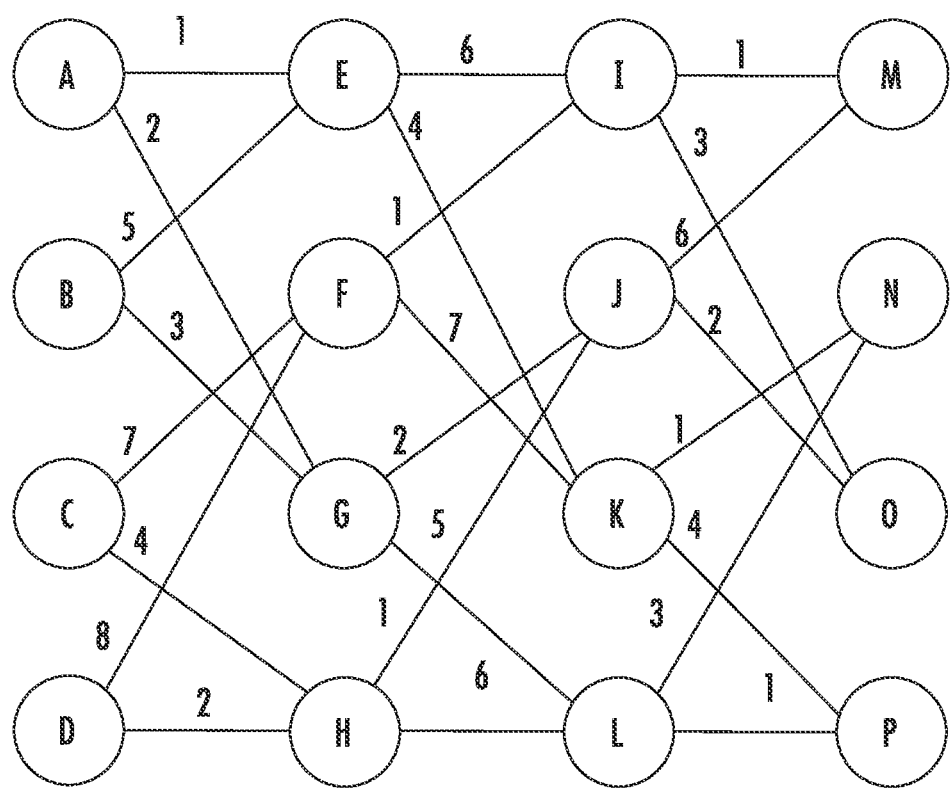
FIG. 3 shows a representative Viterbi trellis with multiple states and multiple stages.

As is known, a Viterbi Algorithm may be modelled as a trellis, having a plurality of states and stages. In certain embodiments, the stages may be related to time, similar to a shift register. The Viterbi algorithm tracks the path metrics through stages, saving only those paths that have the possibility of being the best path, which may be defined as the path with the lowest total cost. For example, FIG. 3 shows an example Viterbi trellis with 4 states and 4 stages. In this figure, the stages are each represented as a column that includes 4 states. In this illustration, Nodes A-D represent the states in the first stage; Nodes E-H represent the states in the second stage; and so on. The values between states represent the cost of that branch, where lower values are more desirable. To calculate the cost of every possible path from each state in the first stage to every state in the last stage is possible, but may be compute and memory intensive. The Viterbi algorithm reduces the number of calculations by only retaining the lowest cost path metrics along the trellis.

In this example, it is assumed that the path metric for each node in the first stage is 0. Note that there are two paths to Node E; from A and from B. Since the cost from Node A is lower, A→E is a survivor path, and the path from B to E can be eliminated from further consideration. Similarly, the lowest cost path to Node F is from C, so C→F is a survivor path and the path from D can be eliminated from further consideration. There are two paths to node G; from A and from B, so A→G is also a survivor path since it has lower cost than B→G. Finally, the path from D to H is the lowest cost path to Node H, so D→H is a survivor path and the path from Node C can be eliminated. Note that there are only 4 survivor paths; one to each of the nodes in the second stage, despite the fact that there are 8 total paths between the first stage and the second stage.

This process is repeated for the third stage. The paths to Node I are A→E→I, which a total cost of 7, and C→F→I, with a cost of 8. Therefore, A→E→I is the survivor path and the other path can be eliminated from further consideration. There are two paths to Node J, where D→H→J is the survivor path and the other path can be eliminated. The lowest cost path to node K is A→E→K, so this is a survivor path. Finally, the lowest cost path to L is A→G→L, which is the survivor path.

This process is repeated again for the fourth stage. Repeating the process described above leaves the following survivor paths:

A→E→I→M: cost=8
A→E→K→N: cost=6
D→H→J→O: cost=5
A→G→L→P: cost=8

Thus, the result is that the most likely path is D→H→J→O, with the lowest cost of 5. This result is considered a hard decision, as the output does not provide any indication that path A→E→K→N was only slightly more costly. An output that indicates that there is a relatively low confidence that this likely path is correct would be considered a soft decision. Having described the basic operation of the Viterbi algorithm, its application to an equalizer will be described.

In one embodiment, for the Viterbi Equalizer, the states are used to represent the last N received bits, so the number of states is defined as $2^N$. In one embodiment, the differentiated phase of a particular data bit is related to its value, as well as the values of the adjacent bits (i.e. the bit immediately preceding the particular bit and the bit immediately following the particular bit). In this embodiment, a four state Viterbi Equalizer may be used. If the differentiated phase of a particular bit is related to more than two other bits, the number of states would be increased accordingly.

Figure 4:
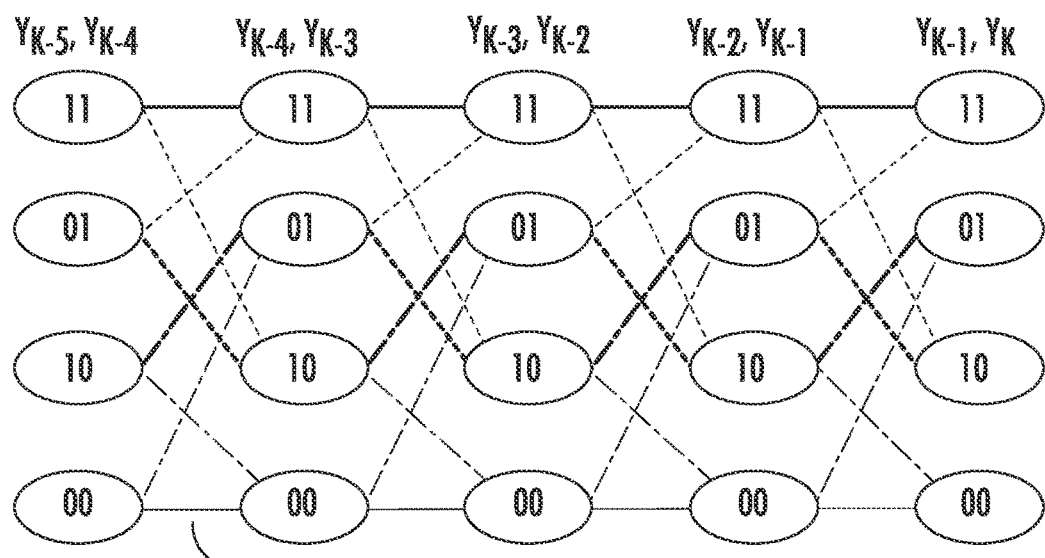
FIG. 4 shows a Viterbi Equalizer utilizing soft decisions according to one embodiment.
Figure 4:
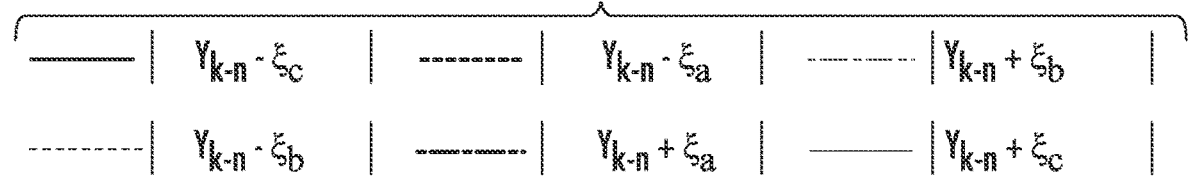

FIG. 4 shows a representative trellis for a 4 stage Viterbi Equalizer 66. As can be seen, the bits enter the trellis at the left and the path moves to the right as more bits are received. Note that each state represents the value of the two most recently received data bits, where the older of the two bits is the leftmost bit. Thus, a value of 01 indicates that the most recent bit was a 1 and the bit before that was a 0. Of course, the states could be defined in the opposite manner, so that the most recent bit is on the left. Each stage represents a different point in time. Thus, as shown in FIG. 4, the states of the rightmost stage represent the two most recently received bits, while the leftmost state represent the bits received 4 bit durations ago.

As new bits are received, the state of the new bit becomes the rightmost bit of the state, while the previously received bit is shifted to the leftmost bit of the state. Thus, if the current state is 01 and a 0 is received, the new state will be 10. Conversely, if a 1 is received, the new state is 11. Therefore, there are exactly two paths exiting each state.

Having described how the states are labelled, the transitions between states will now be described. Each transition between states is assigned a branch metric, which is a measure of the likelihood that this transition is correct. For example, assume that when transitioning from state 11 to the adjacent state 11, it is assumed that the incoming bit would have an expected value of $\xi$. If the incoming bit has this value, then this transition has a path metric of 0, indicating that it is likely a correct transition. If the incoming bit has a different value, then this transition has a non-zero value. Thus, the branch metric between any two stages can be defined as:

$|x-\xi|$ wherein x is the actual value and $\xi$ is the expected value.

Figure 5:
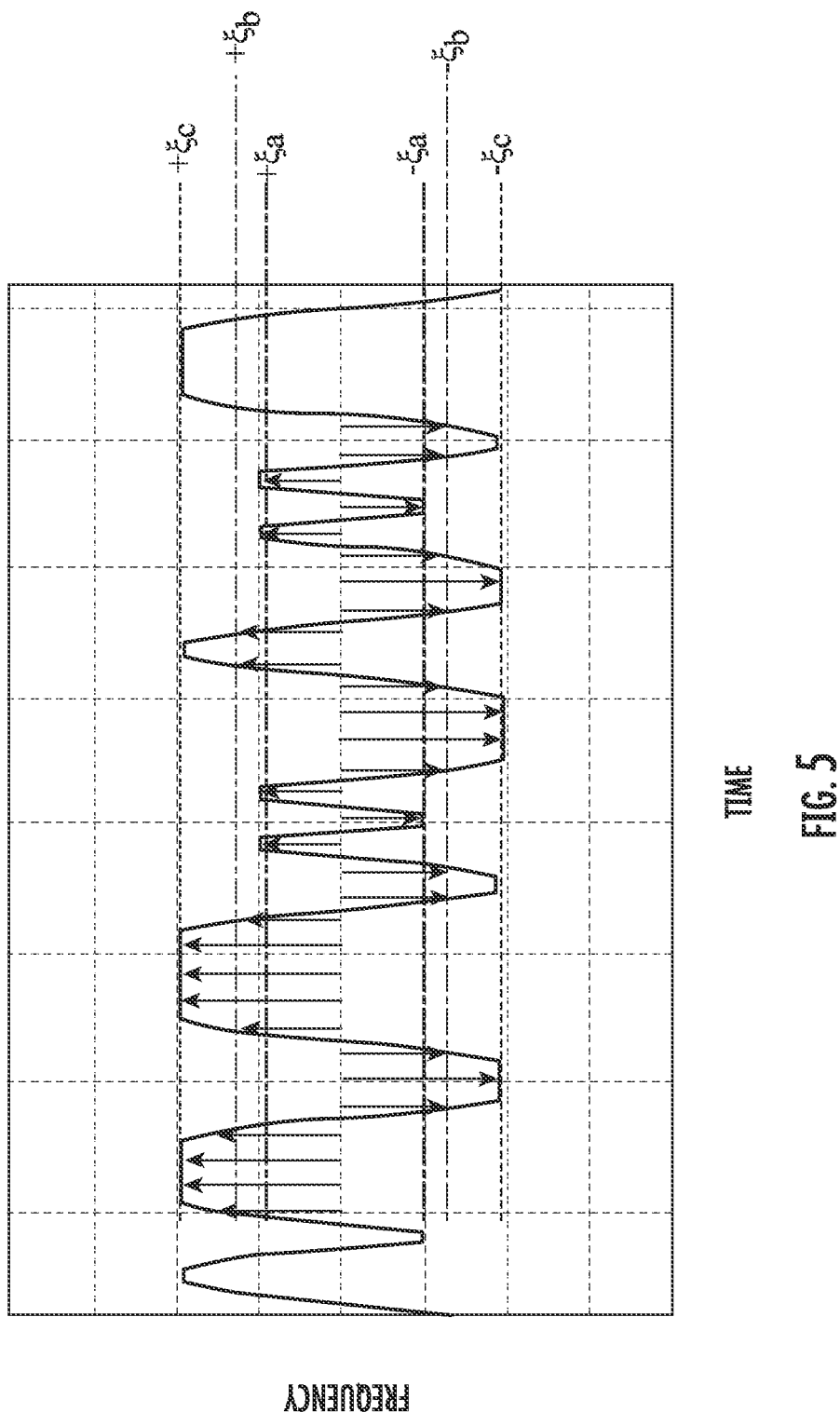
FIG. 5 shows the frequency of bits transmitted wirelessly as a function of the adjacent bits.

FIG. 5 illustrates one approach that may be used to calculate the expected values for each transition. FIG. 5 shows a representative incoming waveform, where the vertical axis represents values that are indicative of the differentiated phase. Note that if a particular bit has a value of 1 and the bit immediately preceding and following that bit also have a value of 1, the differentiated phase of that particular bit is a maximum, referred to as $\xi c$. Likewise, if a particular bit has a value of 0 and the bit immediately preceding and following that bit also have a value of 0, the differentiated phase of that particular bit is also a maximum, referred to as $-\xi c$.

Note that when a string of alternating bits is received, due to the channel bandwidth, the differentiate phase values for these values is reduced. For example, note that if a particular bit has a value of 1 and the bit immediately preceding and following that bit also have a value of 0, the differentiated phase of that particular bit is a minimum, referred to as $\xi a$. Likewise, if a particular bit has a value of 0 and the bit immediately preceding and following that bit also have a value of 1, the differentiated phase of that particular bit is a minimum, referred to as $-\xi a$.

Lastly, if a particular bit is surrounded by bits that are opposite of one another, the differentiated phase will be between the maximum value ($\xi c$) and the minimum value ($\xi a$). This differentiated phase may be referred to as $\xi b$.

Thus, the expected differentiated phase of a bit may be determined based on its value, and the values of the immediately surrounding bits. The following table shows the possible combinations.

| Previous Bit | Current Bit | Next Bit | Expected differentiated phase |
|---|---|---|---|
| 0 | 0 | 0 | $-\xi c$ |
| 0 | 0 | 1 | $-\xi b$ |
| 0 | 1 | 0 | $+\xi a$ |
| 0 | 1 | 1 | $+\xi b$ |
| 1 | 0 | 0 | $-\xi b$ |
| 1 | 0 | 1 | $-\xi a$ |
| 1 | 1 | 0 | $+\xi b$ |
| 1 | 1 | 1 | $+\xi c$ |

Using the information from the above table, the branch metrics for each transition in the trellis shown in FIG. 4 can be determined. These branch metrics are all illustrated in FIG. 4.

Each bit that is received by the Viterbi Equalizer 66 is a multi-bit value, such as an 8-, 16- or 32-bit value.

As bits are received, the Viterbi equalizer calculates each branch metric, by comparing the actual received differentiated phase value to the theoretical value, as described above. At each stage, some of the paths may eliminated, as explained above.

Figure 6:
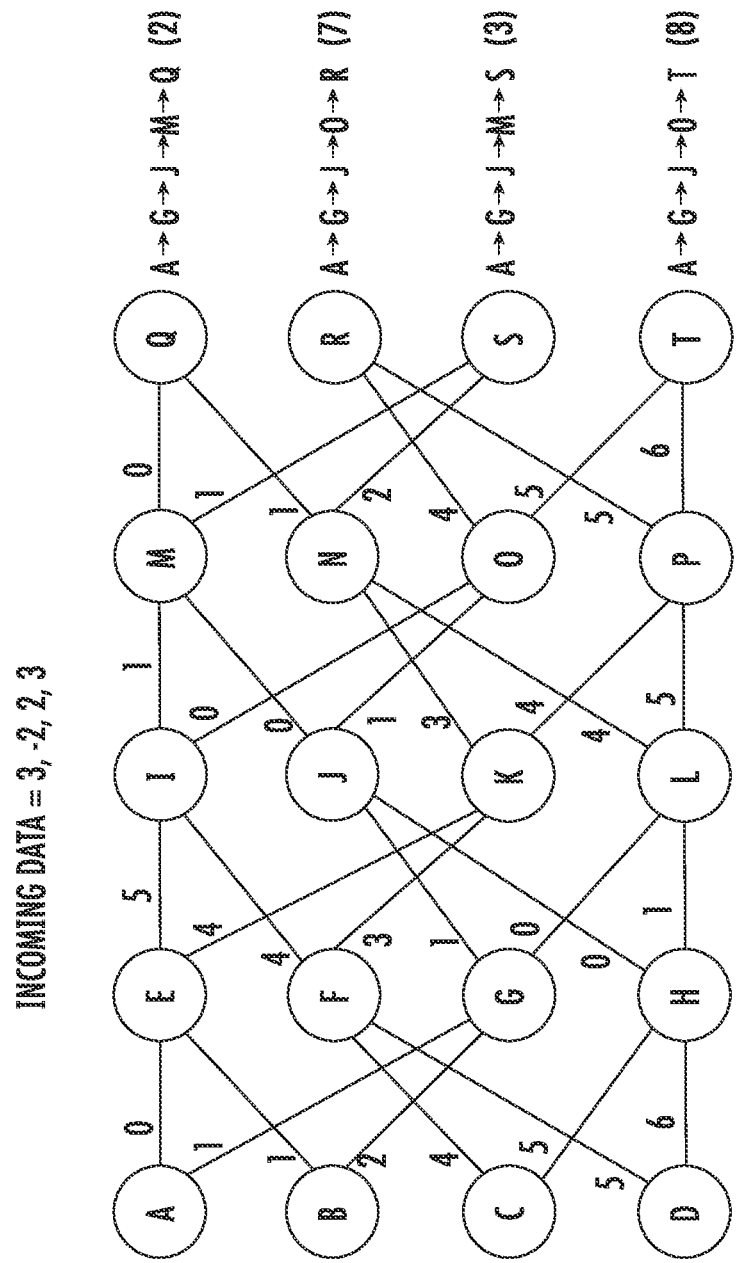
FIG. 6 shows the branch metrics of the Viterbi Equalizer with a first sequence of incoming data bits.

FIG. 6 illustrates the operation of the Viterbi Equalizer. To better describe the paths, the states from FIG. 4 have been relabeled alphabetically. However, each state in FIG. 6 has the same bit definition as the corresponding state in FIG. 4. In this simplistic example, it is assumed that the incoming differentiated phase values are limited to −3, −2, −1, 1, 2, and 3. The expected phase values are defined as follows: $\xi c=3$; $\xi b=2$; and $\xi a=1$.

The incoming data is assumed to comprise the sequence of 3, −2, 2, and 3. Based on these values and the expected phase values, the branch metrics have been populated.

The following table shows the lowest cost branch for each state at each stage. All other paths may be eliminated from consideration.

|          | Stage 1    | Stage 2       | Stage 3          | Stage 4                 |
|----------|------------|---------------|------------------|-------------------------|
| State 11 | A→E (0)    | A→E→J (5)     | A→G→J→M (2)      | A→G→J→M→Q (2)           |
| State 01 | C→F (4)    | A→G→J (2)     | A→G→L→N (5)      | A→G→J→O→R (7)           |
| State 10 | A→G (1)    | A→E→K (4)     | A→G→J→O (3)      | A→G→J→M→S (3)           |
| State 00 | C→H (5)    | A→G→L (1)     | A→G→L→P (6)      | A→G→J→O→T (8)           |

Thus, based on this Viterbi Equalizer, it can be seen that the first bit that was received was the lower digit of A, which is a one. In this example, the Viterbi Equalizer also indicates that the second bit received was the lower digit of G, which is a zero. Note that, at Stage 4, all four states all agree that the beginning of the path was A→G→J. Thus, the confidence in this path is very high. In fact, note that all four states at Stage 3 agree that the beginning of the path was A→G. Thus, it can be assumed that the probability that the first received bit was a 1 is very high. Note that this agrees with intuition, where one would expect a value of 3 would represent a one and a value of −2 would represent a zero.

Figure 7:
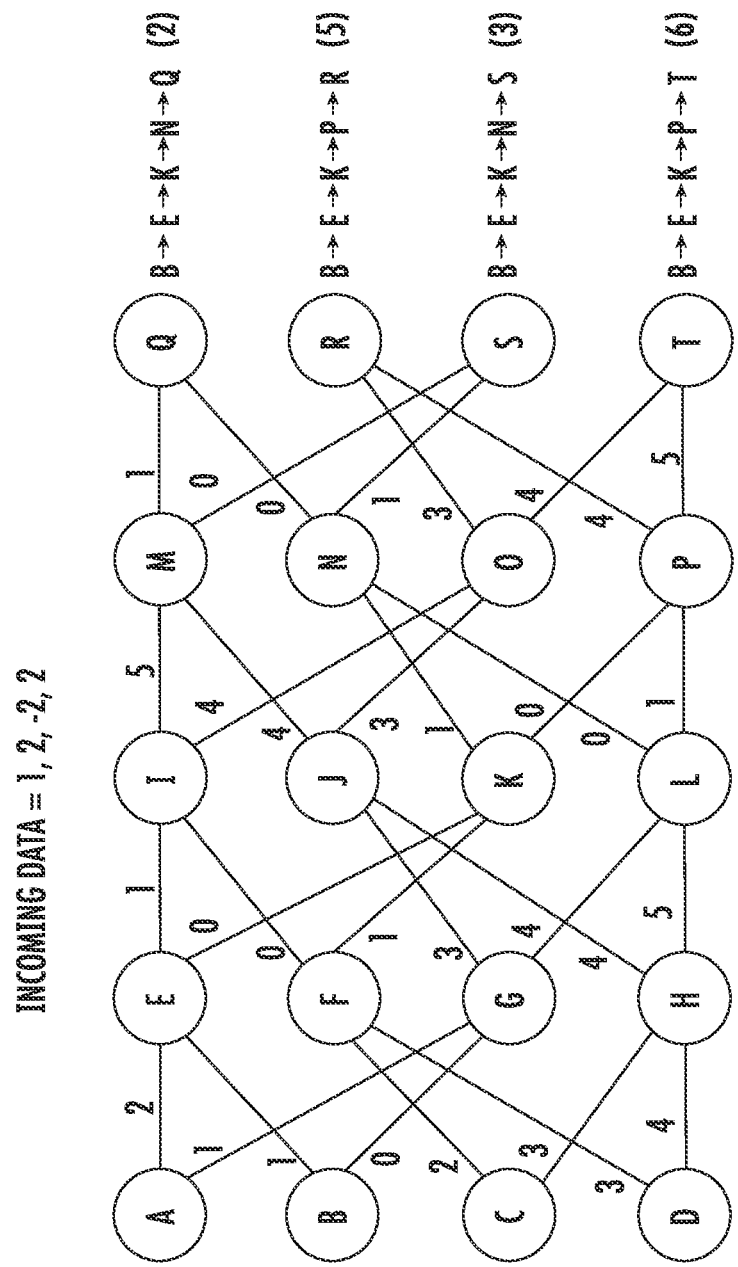
FIG. 7 shows the branch metrics of the Viterbi Equalizer with a second sequence of incoming data bits.

FIG. 7 illustrates the operation of the Viterbi Equalizer using a different data sequence. To better describe the paths, the states from FIG. 4 have been relabeled alphabetically. However, each state in FIG. 7 has the same bit definition as the corresponding state in FIG. 4. In this embodiment, the data sequence is 1, 2, −2, and 2. Based on these values and the expected phase values, the branch metrics have been populated.

The following table shows the lowest cost branch for each state at each stage. All other paths may be eliminated from consideration.

|          | Stage 1   | Stage 2                  | Stage 3                                            | Stage 4         |
|----------|-----------|--------------------------|----------------------------------------------------|-----------------|
| State 11 | B→E (1)   | B→E→J (2)<br>C→F→I (2)   | B→E→I→M (7)<br>C→F→I→M (7)<br>B→G→J→M (7)          | B→E→K→N→Q (2)   |
| State 01 | C→F (2)   | B→G→J (3)                | B→E→K→N (2)                                        | B→E→K→P→R (5)   |
| State 10 | B→G (0)   | B→E→K (1)                | B→E→I→O (6)<br>C→F→I→O (6)<br>B→G→J→O (6)          | B→E→K→N→S (3)   |
| State 00 | C→H (3)   | B→G→L (4)                | B→E→K→P (1)                                        | B→E→K→P→T (6)   |

Thus, based on this Viterbi Equalizer, it can be seen that the first bit that was received was the lower digit of B, which is a one. In this example, the Viterbi Equalizer also indicates that the second bit received was the lower digit of E, which is also one. Note that, at Stage 4, all four states all agree that the beginning of the path was B→E→K. Thus, the confidence in this path is fairly high. However, note that all four states at Stage 3 do not agree that the beginning of the path was B→E. Two of the survivor paths believe that the beginning of the path may be C→F. Thus, it can be assumed that the probability that the first received bit was a 1 is fairly high, but not as high as the previous example.

Figure 8:
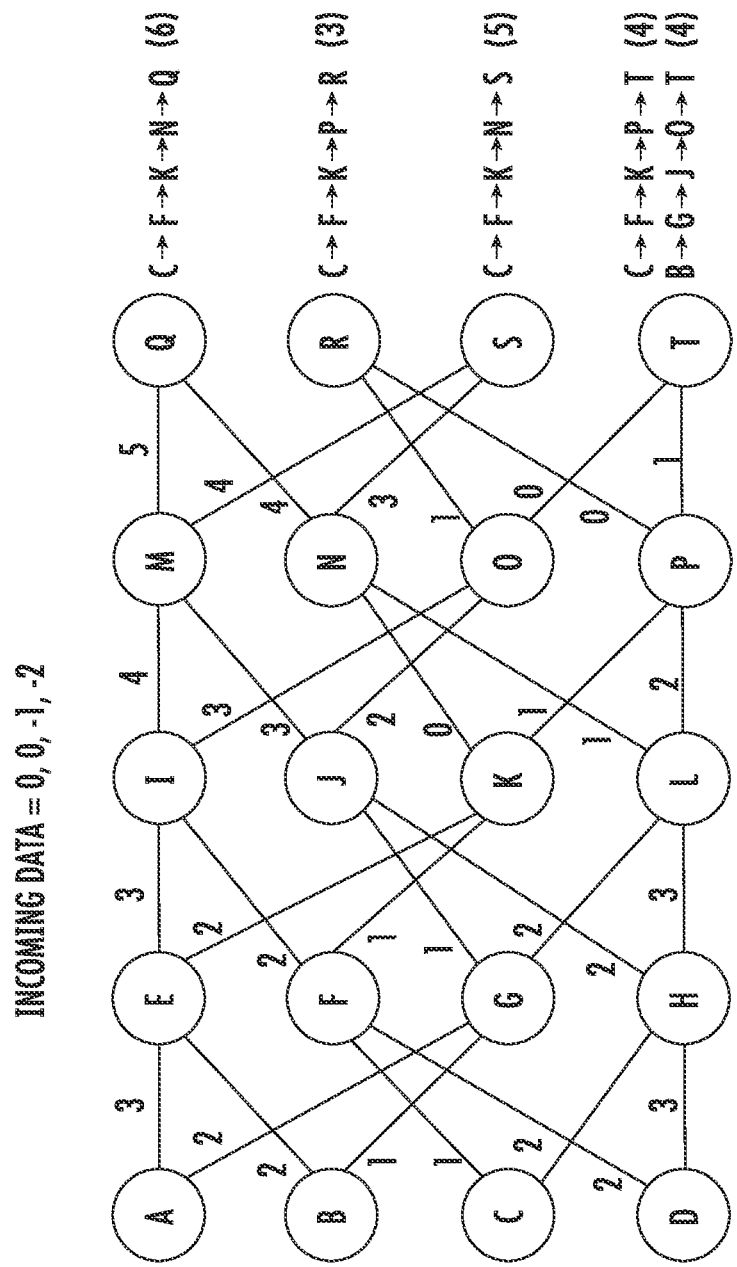
FIG. 8 shows the branch metrics of the Viterbi Equalizer with a third sequence of incoming data bits.

FIG. 8 illustrates the operation of the Viterbi Equalizer using a different data sequence. To better describe the paths, the states from FIG. 4 have been relabeled alphabetically. However, each state in FIG. 8 has the same bit definition as the corresponding state in FIG. 4. In this embodiment, the data sequence is 0, 0, −1, and −2. Based on these values and the expected phase values, the branch metrics have been populated.

The following table shows the lowest cost branch for each state at each stage. All other paths may be eliminated from consideration.

|          | Stage 1   | Stage 2       | Stage 3         | Stage 4                          |
|----------|-----------|---------------|-----------------|----------------------------------|
| State 11 | B→E (2)   | C→F→I (3)     | B→G→J→M (5)     | C→F→K→N→Q (6)                    |
| State 01 | C→F (1)   | B→G→J (2)     | C→F→K→N (2)     | C→F→K→P→R (3)                    |
| State 10 | B→G (1)   | C→F→K (2)     | B→G→J→O (4)     | C→F→K→N→S (5)                    |
| State 00 | C→H (2)   | B→G→L (3)     | C→F→K→P (3)     | B→G→J→O→T (4)<br>C→F→K→P→T (4)   |

Thus, based on this Viterbi Equalizer, it can be seen that the various states of the last stage did not converge on a first value. The survivor path has a path metric of 3, and therefore, the first bit that was received may be the lower digit of C, which is a zero. Three of the states agree that the path begins with C→F, while the other state believes that the beginning of the path may be C→F or B→G. Thus, the confidence in this path is not very high. Thus, it can be assumed that the likelihood that the first received bit was a 0 is not very high, and is lower than the previous two examples.

Thus, to provide the most useful and descriptive data to the outer Viterbi block 68, it would be beneficial to include reliability information, which indicates the confidence in the determination of the bit value. Specifically, the example in FIG. 6 should provide a higher value for the reliability information than the example in FIG. 7. Likewise, the examples in FIGS. 6 and 7 should provide a higher value for the reliability information than the example in FIG. 8.

Figure 9:
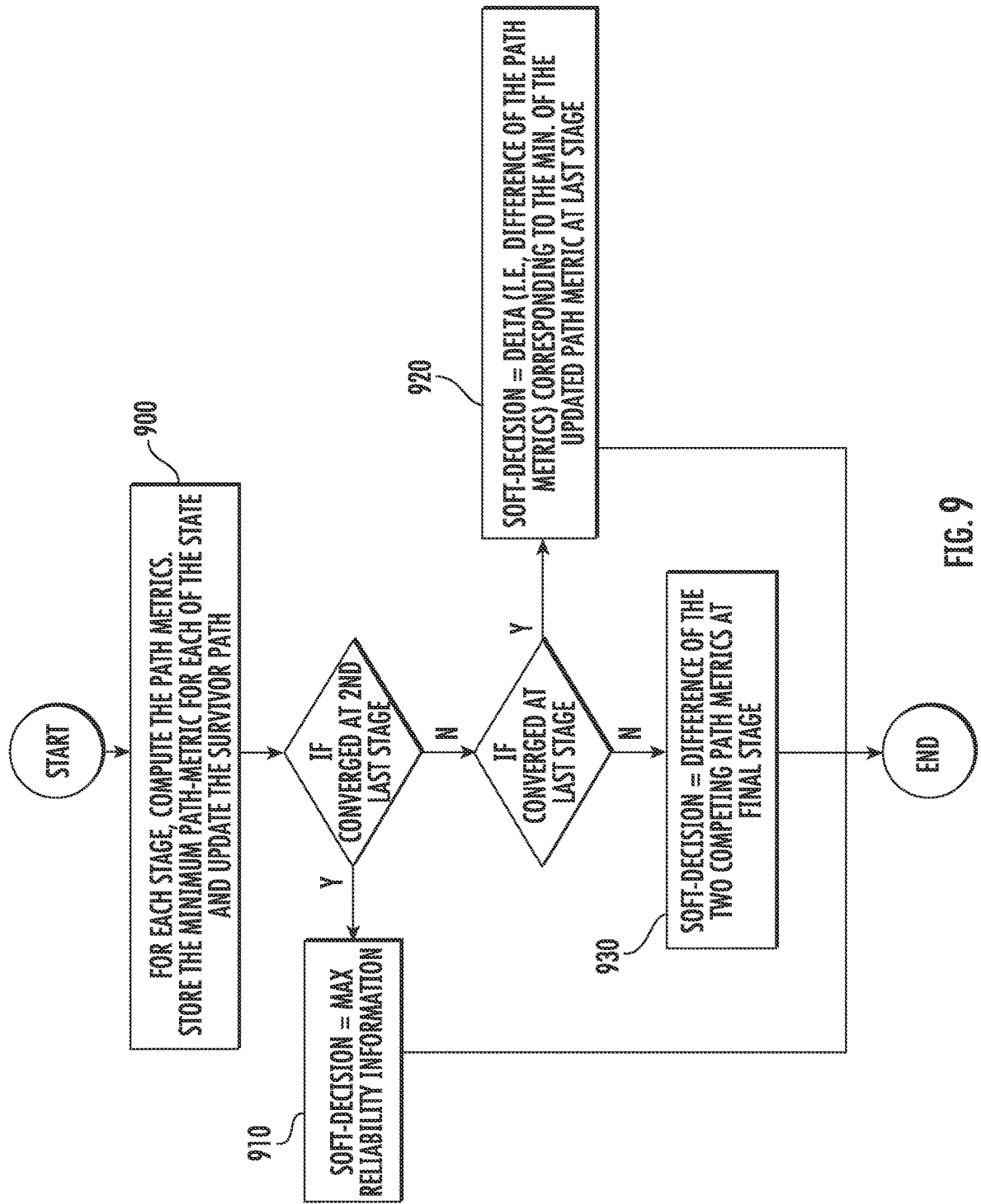
FIG. 9 shows a flow chart illustrating the operation of the Viterbi Equalizer.

FIG. 9 provides a flow chart showing how the reliability value can be determined. First, as shown in Box 900, for each stage, the path metrics are computed. As described above, the minimum path metric for each state is stored.

Next, as shown in Box 910, the algorithm checks to see if all of the states in the next to last stage have converged. As described above, with respect to FIG. 6, all of the states in Stage 3 agreed that the beginning of the path was A→G.

This represents the highest level of reliability. Thus, if all of the states in the next to last stage converge on the same value, this value is determined to be the final decision, and the maximum reliability value associated with that final decision is assigned, as shown in Box 910. The final decision that is being calculated here is for the value of the first bit that was fed into the Viterbi Equalizer.

If, however, all of the states in the next to last state do not agree on the beginning of the path, the algorithm continues. For example, note that in FIG. 7, there are several states that believed that the beginning of the path was B→E, while other states believed that the beginning of the path may be C→F. In this case, the algorithm checks if the states in the last stage all converged.

If all states in the last stage converged, the algorithm defines the reliability information as shown in Box 920. First, the final surviving state (i.e. the state that terminates the survivor path) is identified. In the example shown in FIG. 7, this would be state Q. Since the survivor path begins with B→E, the final decision is the lower bit of state B, or one. Next, the algorithm calculates the difference between the two minimum path metrics that result in state Q. In the example shown in FIG. 7, the minimum path was B→E→K→N→Q, with a path metric of 2. There were three other paths that led to state Q. These other paths were B→E→I→M→Q; C→F→I→M→Q; and B→G→J→M→Q. Each of these competing paths had a path metric of 8. The reliability information provided in the scenario is indicative of the difference between the survivor path and the alternate path that leads to the same state Q. Thus, in this example, the reliability information would be indicative of a difference of 6.

Figure 10:
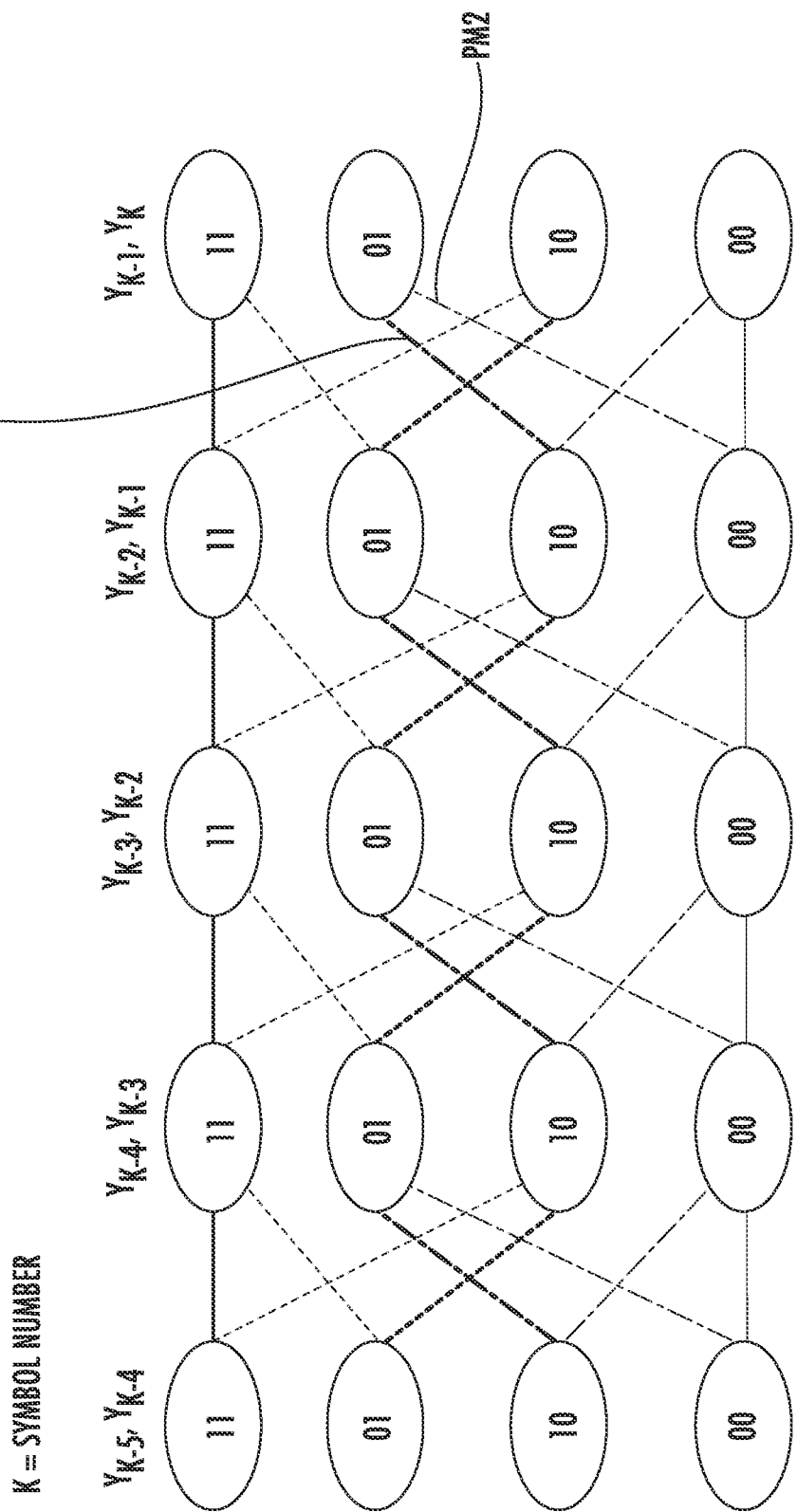
FIG. 10 illustrates the decision criteria in a scenario where all final states reach same final decision.

This is illustrated in FIG. 10. Assume that the survivor path terminates at state 01. There are two paths that terminate in state 01 of stage 4. Each has a path metric, which are labelled PM1 and PM2. PM1 may be assumed to be the path metric of the survivor path, while PM2 is the path metric of the other path that terminated at state 01. In this scenario, the reliability is based on the difference between PM1 and PM2.

Returning to FIG. 9, in some embodiments, the states in the final stage do not converge on a path. For example, in FIG. 8, state T results in a different path than the other states. In this scenario, the final decision is determined based on the survivor path, which is lower bit of state C, or zero. In this case, as shown in Box 930, the reliability information is determined by comparing the path metric of the survivor path and the smallest path metric that results in a different final decision. In FIG. 8, the shortest path that resulted in a different final decision is B→G→J→O→T, which has a path metric of 4. Thus, in this scenario, the reliability information would be based on the difference between the path metric of the survivor path and the path noted above.

Figure 11:
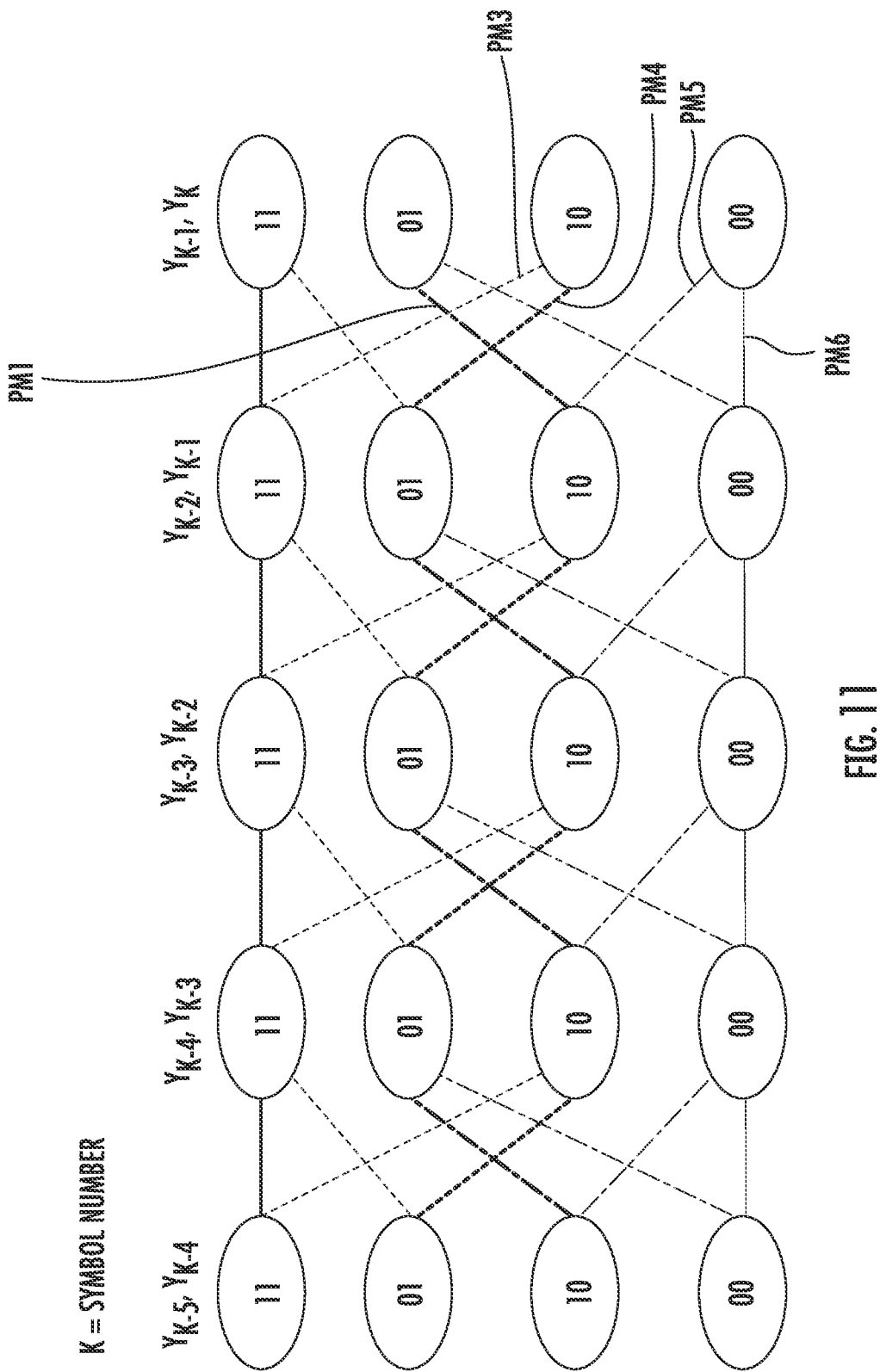
FIG. 11 illustrates the decision criteria in a scenario where all final states do not reach same final decision.

This is illustrated in FIG. 11. Assume that the survivor path terminates in state 01. The survivor path that terminates in state 01 of stage 4 is labelled PM1. In this illustration, assume state 01 and state 11 both have a final decision that the bit was a one. States 10 and 00 have a final decision that the bit was a 0. Paths PM3-PM4 terminate in state 10 while paths PM5-PM6 terminate in state 00. Since state 11 has the same final decision as the survivor path, its path metrics are not relevant. In this scenario, the algorithm determines the smallest path metric (from PM3-PM6) that results in a different final decision. The smallest of PM3-PM6 is then compared to PM1 to determine the reliability information. In other words, the reliability information is based on the difference between PM1 and the smallest of PM3-PM6.

This aspect of the Viterbi Equalizer is important, as it allows the Viterbi Equalizer to generate soft decisions without needing all paths to converge on the same final decision. In an equalizer that only has a limited number of stages, this ability is critical to the successful operation of the Viterbi Equalizer.

Thus, the output from the Viterbi Equalizer 66 is a final decision, and reliability information regarding that final decision. In certain embodiments, the reliability information may be five bits. Thus, when the scenario described in Box 910 occurs, the reliability information may be the maximum value, such as 31. For all other scenarios, the reliability information may be between 1 and 31. This reliability information, combined with the final decision, yields a soft decision that has a value between −32 and 31. In certain embodiments, the values of −32 and 0 may not be used. This soft decision is then used as an input to the Outer Viterbi Block 68.

While the above disclosure describes the use of the Viterbi Equalizer in a wireless network device, other applications are also possible. For example, Viterbi Equalizer maybe used in wired communication devices.

While this disclosure describes a Viterbi Equalizer having 4 stages and 4 states, the concepts described herein can apply to other applications with a different number of stages and/or states. For example, the Viterbi Equalizer may have 16 or fewer stages. Importantly, the concepts described here allow a Viterbi block to provide a final decision with reliability information (i.e. a soft decision) even when the paths do not all converge.

The present system has many advantages. It is estimated that the use of soft decisions by the Viterbi Equalizer results in gains of 1-4 dB as compared to classical hard decision equalizers. Further, the present Viterbi Equalizer generates the soft decisions within 4 bit durations. In contrast, other methods rely on a trellis that is sufficiently long such that the final states always converge, which is the scenario shown in Box 920 of FIG. 9. However, these methods cannot operate if the states do not converge, such as shown in Box 930 of FIG. 9. Further, this Viterbi Equalizer has lower complexity and reduced overall operations as compared to other prior art techniques. If the stages of the Viterbi Equalizer were increased to guarantee convergence of all survivor paths, the number of transistors would be increased. Further, the delay through the read channel would also be extended.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A Viterbi Equalizer, comprising a first plurality of stages, each stage comprising a second plurality of states, wherein an input to the Viterbi Equalizer comprises a stream of differentiated phase values, each indicative of a differentiated phase of an incoming data bit, wherein exactly one differentiated phase value is associated with each incoming data bit, wherein the Viterbi Equalizer is configured to determine a value of each incoming data bit based on the differentiated phase values, wherein the Viterbi Equalizer outputs a final decision and a reliability information associated with the final decision.

2. The Viterbi Equalizer of claim 1, wherein the first plurality comprises four stages.

3. The Viterbi Equalizer of claim 1, wherein the second plurality comprises four states.

4. The Viterbi Equalizer of claim 1, wherein branch metrics between states are calculated based on a difference between the differentiated phase value and an expected value, wherein the expected value is determined based on a differentiated phase value of the incoming data bit and the differentiated phase values of incoming data bits immediately adjacent to the incoming data bit.

5. The Viterbi Equalizer of claim 4, wherein six expected values are used in calculating the branch metrics.

6. The Viterbi Equalizer of claim 5, wherein a first expected value is used when the incoming data bit is a one and the incoming data bits immediately adjacent to the incoming data bit are also one;

and wherein a second expected value, having an equal amplitude and opposite polarity of the first expected value is used when the incoming data bit is a zero and the incoming data bits immediately adjacent to the incoming data bit are also zero.

7. The Viterbi Equalizer of claim 5, wherein a third expected value is used when the incoming data bit is a one and the incoming data bits immediately adjacent to the incoming data bit are zero;

and wherein a fourth expected value, having an equal amplitude and opposite polarity of the third expected value is used when the incoming data bit is a zero and the incoming data bits immediately adjacent to the incoming data bit are one.

8. The Viterbi Equalizer of claim 5, wherein a fifth expected value is used when the incoming data bit is a one and exactly one of the incoming data bits immediately adjacent to the incoming data bit is one;

and wherein a sixth expected value, having an equal amplitude and opposite polarity of the fifth expected value is used when the incoming data bit is a zero and exactly one of the incoming data bits immediately adjacent to the incoming data bit is zero.

9. The Viterbi Equalizer of claim 1, wherein the reliability information is calculated as a maximum value, if all paths in the Viterbi Equalizer converge on a same final decision in a stage prior to a last stage.

10. The Viterbi Equalizer of claim 1, wherein a path from a first stage to a last stage having a smallest path metric is referred to as a survivor path, and wherein a state in the last stage where the survivor path terminates is referred to as a terminal state, and wherein the reliability information is calculated based on a difference in path metrics between two paths leading to a terminal state if all paths in the Viterbi Equalizer converge on a same final decision in the last stage.

11. The Viterbi Equalizer of claim 1, wherein a path from a first stage to a last stage having a smallest path metric is referred to as a survivor path, and wherein a state in the last stage where the survivor path terminates is referred to as a terminal state and is used to determine the final decision, and wherein at least one state in the last stage reaches a different final decision, and the reliability information is calculated based on a difference in path metrics between the survivor path and a smallest path leading to a state in the last stage that reaches the different final decision.

12. A Viterbi Equalizer, comprising a first plurality of stages, each stage comprising a second plurality of states, wherein an input to the Viterbi Equalizer comprises a stream of input values, each indicative of an incoming data bit, wherein exactly one input value is associated with each incoming data bit, wherein the Viterbi Equalizer is configured to determine a value of each incoming data bit based on the input values, wherein the Viterbi Equalizer outputs a final decision and a reliability information associated with the final decision, and wherein all paths within the Viterbi Equalizer are not guaranteed to converge on the final decision in a last stage.

13. The Viterbi Equalizer of claim 12, wherein the reliability information is calculated as a maximum value, if all paths in the Viterbi Equalizer converge on a same final decision in a stage prior to the last stage.

14. The Viterbi Equalizer of claim 12, wherein a path from a first stage to the last stage having a smallest path metric is referred to as a survivor path, and wherein a state in the last stage where the survivor path terminates is referred to as a terminal state, wherein the reliability information is calculated based on a difference in path metrics between two paths leading to the terminal state if all paths in the Viterbi Equalizer converge on a same final decision in the last stage.

15. The Viterbi Equalizer of claim 12, wherein a path from a first stage to the last stage having a smallest path metric is referred to as a survivor path, and wherein a state in the last stage where the survivor path terminates is referred to as a terminal state and is used to determine the final decision, and wherein at least one state in the last stage reaches a different final decision, and the reliability information is calculated based on a difference in path metrics between the survivor path and a smallest path leading to a state in the last stage that reaches the different final decision.

16. The Viterbi Equalizer of claim 12, wherein the first plurality of stages comprises 16 or fewer stages.

17. A Viterbi Equalizer, comprising a first plurality of stages, each stage comprising a second plurality of states, wherein an input to the Viterbi Equalizer comprises a stream of input values, each indicative of an incoming data bit, wherein exactly one input value is associated with each incoming data bit, wherein the Viterbi Equalizer is configured to determine a value of each incoming data bit based on the input values, wherein the Viterbi Equalizer outputs a final decision and a reliability information associated with the final decision, and wherein a path from a first stage to a last stage having a smallest path metric is referred to as a survivor path, and wherein a state in the last stage where the survivor path terminates is referred to as a terminal state and is used to determine the final decision, and wherein at least one state in the last stage reaches a different final decision, and the reliability information is calculated based on a difference in path metrics between the survivor path and a smallest path leading to a state in the last stage that reaches the different final decision.

18. The Viterbi Equalizer of claim 17, wherein the reliability information is calculated based on a difference in path metrics between two paths leading to the terminal state if all paths in the Viterbi Equalizer converge on a same final decision in the last stage.

19. The Viterbi Equalizer of claim 17, wherein the reliability information is set to a maximum value if all paths in the Viterbi Equalizer converge on the same final decision in a next to last stage.

* * * * *